(12) United States Patent
Nakao (10) Patent No.: US 9,362,294 B2
(45) Date of Patent: *Jun. 7, 2016

(54) SEMICONDUCTOR DEVICE INCLUDING AN ELECTRODE LOWER LAYER AND AN ELECTRODE UPPER LAYER AND METHOD OF MANUFACTURING SEMICONDUCTOR DEVICE

(71) Applicant: ROHM CO., LTD., Kyoto (JP)

(72) Inventor: Yuichi Nakao, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/516,639

(22) Filed: Oct. 17, 2014

(65) Prior Publication Data

US 2015/0035118 A1 Feb. 5, 2015

Related U.S. Application Data

(62) Division of application No. 12/585,831, filed on Sep. 25, 2009, now Pat. No. 8,907,389.

(30) Foreign Application Priority Data

Sep. 26, 2008 (JP) .................................. 2008-248901

(51) Int. Cl.
*H01L 27/115* (2006.01)
*H01L 49/02* (2006.01)

(52) U.S. Cl.
CPC .... *H01L 27/11507* (2013.01); *H01L 27/11502* (2013.01); *H01L 28/55* (2013.01); *H01L 28/57* (2013.01); *H01L 28/60* (2013.01); *H01L 28/75* (2013.01)

(58) Field of Classification Search
CPC ... H01L 27/11507; H01L 28/55; H01L 28/60; H01L 27/11502; H01L 28/57
USPC .................................................. 257/295, 774
See application file for complete search history.

(56) References Cited

U.S. PATENT DOCUMENTS

| | | | |
|---|---|---|---|
| 6,278,153 B1 | 8/2001 | Kikuchi et al. | |
| 6,737,694 B2 * | 5/2004 | Kim et al. | 257/296 |
| 6,855,974 B2 * | 2/2005 | Matsuura et al. | 257/295 |
| 7,078,785 B2 * | 7/2006 | Ciancio et al. | 257/532 |
| 7,897,413 B2 * | 3/2011 | Wang et al. | 438/3 |
| 7,960,228 B2 * | 6/2011 | Wang et al. | 438/256 |
| 2001/0034106 A1 | 10/2001 | Moise et al. | |
| 2002/0003247 A1 * | 1/2002 | Yokoyama et al. | 257/296 |
| 2002/0149040 A1 * | 10/2002 | Sun et al. | 257/295 |

(Continued)

FOREIGN PATENT DOCUMENTS

| | | |
|---|---|---|
| JP | 2004-153019 A | 5/2004 |
| JP | 2006-032734 A | 2/2006 |
| JP | 2006-135078 A | 5/2006 |

*Primary Examiner* — Ori Nadav
(74) *Attorney, Agent, or Firm* — Rabin & Berdo, P.C.

(57) ABSTRACT

The semiconductor device according to the present invention includes a ferroelectric film and an electrode stacked on the ferroelectric film. The electrode has a multilayer structure of an electrode lower layer in contact with the ferroelectric film and an electrode upper layer stacked on the electrode lower layer. The electrode upper layer is made of a conductive material having an etching selection ratio with respect to the materials for the ferroelectric film and the electrode lower layer. The upper surface of the electrode upper layer is planarized.

13 Claims, 7 Drawing Sheets

(56) References Cited

U.S. PATENT DOCUMENTS

| | | |
|---|---|---|
| 2003/0006439 A1 | 1/2003 | Bailey |
| 2003/0098497 A1 | 5/2003 | Solayappan et al. |
| 2004/0113189 A1 | 6/2004 | Takamatsu et al. |
| 2006/0118841 A1 | 6/2006 | Eliason et al. |
| 2006/0175642 A1* | 8/2006 | Dote et al. ............... 257/295 |
| 2006/0281316 A1* | 12/2006 | Komuro et al. .......... 438/694 |
| 2007/0102741 A1* | 5/2007 | Moon et al. .............. 257/295 |
| 2008/0111241 A1* | 5/2008 | Wang ........................ 257/751 |

* cited by examiner

SEMICONDUCTOR DEVICE INCLUDING AN ELECTRODE LOWER LAYER AND AN ELECTRODE UPPER LAYER AND METHOD OF MANUFACTURING SEMICONDUCTOR DEVICE

CROSS-REFERENCE TO RELATED APPLICATION

This application is a divisional of application Ser. No. 12/585,831, filed on Sep. 25, 2009. Furthermore, this application claims the benefit of priority of Japanese application 2008-248901, filed Sep. 26, 2008. The disclosures of these prior U.S. and Japanese applications are incorporated herein by reference.

BACKGROUND OF THE INVENTION

1. Field of the Invention

The present invention relates to a semiconductor device employing a ferroelectric substance and a method of manufacturing the same.

2. Description of Related Art

A ferroelectric memory (FeRAM: Ferroelectric Random Access Memory) holding data through the hysteresis of a ferroelectric substance is known as one of nonvolatile memories.

In general, there are two types of ferroelectric memories having different cell structures. One of the ferroelectric memories has a 1T1C cell structure including a field-effect transistor for selecting a memory cell and a ferroelectric capacitor, while the other one has a 1T cell structure including a field-effect transistor having a gate insulating film made of a ferroelectric substance.

Figure 3:
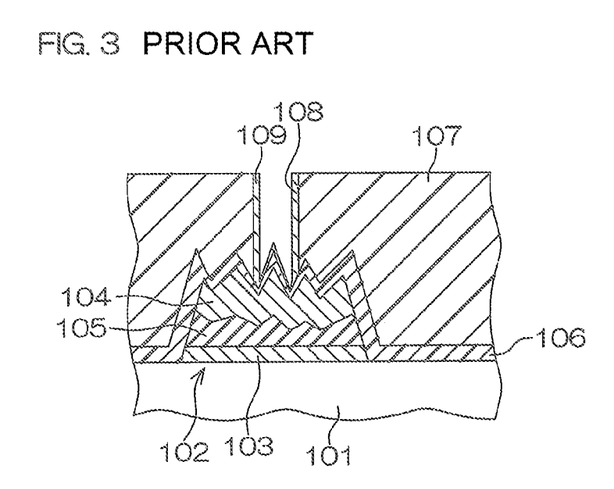
FIG. 3 is a schematic sectional view showing a portion around a ferroelectric capacitor of a conventional semiconductor device (ferroelectric memory).

FIG. 3 is a schematic sectional view showing a portion around a ferroelectric capacitor of a ferroelectric memory having a 1T1C cell structure.

The ferroelectric memory includes a silicon substrate (not shown). A field-effect transistor is formed on the silicon substrate every memory cell. A first interlayer dielectric film 101 made of $SiO_2$ (silicon oxide) is stacked on the silicon substrate. A ferroelectric capacitor 102 is formed on the first interlayer dielectric film 101 every memory cell.

The ferroelectric capacitor 102 has a multilayer structure formed by interposing a ferroelectric film 105 between a lower electrode 103 and an upper electrode 104. The lower electrode 103 and the upper electrode 104 are made of a conductive material containing Ir (iridium). The ferroelectric film 105 is made of PZT (lead zirconate titanate: $Pb(Zr,Ti)O_3$).

The ferroelectric capacitor 102 is formed by stacking a multilayer film made of the materials for the lower electrode 103, the ferroelectric film 105 and the upper electrode 104 on the first interlayer dielectric film 101, thereafter forming an etching mask on the multilayer film and etching portions of the multilayer film exposed from the etching mask. Ir and PZT are hard to etch, and hence the ferroelectric capacitor 102 has a trapezoidal sectional shape tapered upward.

The surfaces of the first interlayer dielectric film 101 and the ferroelectric capacitor 102 are covered with a hydrogen barrier film 106 made of $Al_2O_3$ (alumina). Thus, the ferroelectric film 105 can be prevented from characteristic deterioration resulting from hydrogen reduction.

A second interlayer dielectric film 107 made of $SiO_2$ is stacked on the hydrogen barrier film 106.

A via hole 108 is formed in the second interlayer dielectric film 107 above the ferroelectric capacitor 102. The via hole 108 penetrates through the second interlayer dielectric film 107, further penetrates through the hydrogen barrier film 106, and reaches the upper electrode 104 of the ferroelectric capacitor 102. A barrier metal film 109 made of TiN (titanium nitride) is formed on the inner surface of the via hole 108. A plug (not shown) made of W (tungsten) for electrical connection between the upper electrode 104 and a wire (not shown) is embedded in the via hole 108 through the barrier metal film 109.

Reduction of the thickness of the ferroelectric film 105 has recently been examined, in order to refine the ferroelectric memory and to reduce the voltage thereof.

Sputtering and a sol-gel process are widely known as methods of forming a film (a PZT film) made of PZT employed as the material for the ferroelectric film 105. When a PZT film having a thickness of not more than 100 nm is formed by sputtering or the sol-gel process, however, the PZT film cannot attain crystallinity capable of exhibiting excellent ferroelectricity. Therefore, it is difficult to reduce the thickness of the ferroelectric film 105 (the PZT film) to not more than 100 nm according to sputtering or the sol-gel process.

MOCVD (Metal Organic Chemical Vapor Deposition) may be employed as a film forming method capable of reducing the thickness of the ferroelectric film 105 while ensuring crystallinity thereof. However, a PZT film formed by MOCVD has large crystal grain sizes and inferior surface morphology (has large irregularities formed on the surface thereof). Therefore, the surface morphology of the upper electrode 104 stacked on the ferroelectric film 105 consisting of the PZT film is also deteriorated. Consequently, defective coverage (including a state where the hydrogen barrier film 106 and/or the barrier metal film 109 has an extremely thin portion) of the hydrogen barrier film 106 or the barrier metal film 109 in contact with the hydrogen barrier film 106 may be caused on the upper electrode 104 (the ferroelectric capacitor 102). Defective coverage of the hydrogen barrier film 106 results in characteristic deterioration of the ferroelectric film 105. When defective coverage of the barrier metal film 109 is caused, the barrier metal film 109 may be peeled or corroded due to reaction between $WF_6$ (tungsten hexafluoride) and $SiO_2$ forming the second interlayer dielectric film 107 in the process of embedding the plug made of tungsten in the via hole 108 by CVD (Chemical Vapor Deposition).

SUMMARY OF THE INVENTION

An object of the present invention is to provide a semiconductor device capable of preventing defective coverage of films on an electrode when the films (a hydrogen barrier film and a barrier metal film) are formed on the electrode and a method of manufacturing the same.

A semiconductor device according to an aspect of the present invention includes a ferroelectric film and an electrode stacked on the ferroelectric film. The electrode having a multilayer structure of an electrode lower layer in contact with the ferroelectric film and an electrode upper layer stacked on the electrode lower layer is stacked on the ferroelectric film. The upper surface of the electrode upper layer is planarized into a planar surface independent of the surface morphology of the ferroelectric film. When a film is formed on the electrode upper layer (the electrode), therefore, the film can be formed with a generally uniform thickness on the electrode, and defective coverage of the film on the electrode can be prevented.

The electrode upper layer is made of a conductive material having an etching selection ratio (etching selectivity) with respect to the materials for the ferroelectric film and the electrode lower layer. After formation of the electrode upper layer, therefore, the electrode upper layer can be utilized as an etching mask for forming the ferroelectric film and the electrode lower layer. In other words, the ferroelectric film and the electrode lower layer can be formed by successively stacking films made of the materials for the ferroelectric film, the electrode lower layer and the electrode upper layer, planarizing the film made of the material for the electrode upper layer, thereafter forming the electrode upper layer by patterning the film, and etching the films made of the materials for the ferroelectric film and the electrode lower layer through the electrode upper layer serving as a mask. That is, the etching mask can be left as the electrode upper layer as such by planarizing the etching mask for forming the ferroelectric film and the electrode lower layer.

The semiconductor device having the aforementioned structure can be manufactured by a method including the following steps I to VI:

I. forming a ferroelectric material film made of a ferroelectric material;
II. forming a first conductive material film made of a conductive material on the ferroelectric material film;
III. forming a second conductive material film made of a conductive material having an etching selection ratio with respect to the ferroelectric material and the conductive material on the first conductive material film;
IV. planarizing the upper surface of the second conductive material film;
V. forming an electrode upper layer consisting of the second conductive material film by patterning the second conductive material film after the planarization; and
VI. forming a ferroelectric film consisting of the ferroelectric material film and an electrode lower layer consisting of the conductive material film by etching the ferroelectric material film and the conductive material film through the electrode upper layer serving as a mask.

In order to planarize the upper surface of the electrode, the ferroelectric film or the electrode lower layer may conceivably be planarized. If the ferroelectric film is planarized, however, bad influence is exerted on the crystallinity thereof, to reduce the ferroelectricity. If the electrode lower layer is made of a conductive material containing a noble metal such as Ir, it is difficult to planarize the electrode lower layer.

Therefore, the electrode upper layer is preferably made of TiN, TaN (tantalum nitride) or WN (tungsten nitride). When the electrode upper layer is made of such a material, the upper surface thereof can be easily planarized.

The semiconductor device may include a hydrogen barrier film covering the surfaces of the ferroelectric film and the electrode. The electrode has the planar upper surface, whereby defective coverage of the hydrogen barrier film on the electrode can be prevented. Consequently, the hydrogen barrier film can excellently prevent the ferroelectric film from hydrogen reduction, thereby preventing characteristic deterioration of the ferroelectric film.

The semiconductor device may further include an insulating film stacked on the hydrogen barrier film, and a plug, made of a metallic material, embedded in a via hole penetrating through the insulating film and the hydrogen barrier film.

When a surface layer portion of the electrode lower layer is made of a material such as an IrTa (iridium tantalum) alloy having hydrogen barrier properties and the via hole penetrates through the surface layer portion of the electrode lower layer, the hydrogen barrier properties may be deteriorated and the characteristics of the ferroelectric film may be deteriorated due to penetration of H (hydrogen) from the via hole.

Therefore, the deepest portion of the via hole is preferably arranged on an intermediate portion in the thickness direction of the electrode upper layer. Thus, hydrogen barrier properties can be ensured with the surface layer portion of the electrode lower layer when the surface layer portion of the electrode lower layer is made of a material such as an IrTa alloy having the hydrogen barrier properties, and the ferroelectric film can be prevented from characteristic deterioration resulting from penetration of H from the via hole.

The semiconductor device may further include a barrier metal film interposed between the inner surface of the via hole and the plug. The barrier metal film can prevent metal diffusion from the plug into the insulating film. Further, defective coverage of the barrier metal film on the electrode can be prevented due to the planar upper surface of the electrode.

Defective coverage of the barrier metal film can be so prevented that reaction between $WF_6$ gas and the material for the insulating film can be prevented in the process of embedding the via hole when the plug is made of tungsten, even if the plug is embedded by CVD. Therefore, the barrier metal film can be prevented from peeling and corrosion.

The semiconductor device including the barrier metal film interposed between the inner surface of the via hole and the plug can be manufactured by a method including the following steps VII to XII in addition to the steps I to IV:

VII. forming a hydrogen barrier film covering the ferroelectric film, the electrode lower layer and the electrode upper layer;
VIII. forming an insulating film on the hydrogen barrier film;
IX. forming a via hole penetrating through the insulating film and the hydrogen barrier film from the upper surface of the insulating film to be dug up to an intermediate portion in the thickness direction of the electrode upper layer;
X. forming a barrier metal material film on the insulating film including the inner surface of the via hole;
XI. forming a plug material layer on the barrier metal material film to fill up the via hole; and
XII. forming a barrier metal film and a plug in the via hole by removing portions of the barrier metal material film and the plug material layer located outside the via hole.

The semiconductor device may include a lower electrode opposed to the electrode through the ferroelectric film. In other words, the semiconductor device may include a ferroelectric capacitor consisting of the ferroelectric film, the electrode and the lower electrode.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
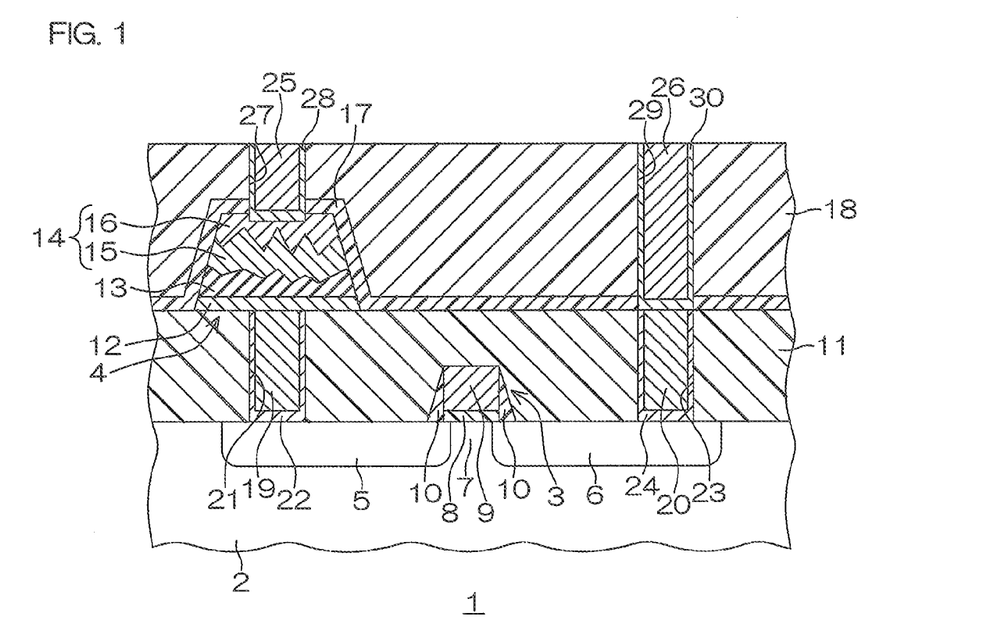
FIG. 1 is a schematic sectional view showing the structure of a semiconductor device according to an embodiment of the present invention.

FIG. 1 is a schematic sectional view showing the structure of a semiconductor device according to an embodiment of the present invention.

A semiconductor device 1 is a ferroelectric memory including a plurality of memory cells each having a 1T1C cell structure. FIG. 1 shows the cell structure of one memory cell.

The semiconductor device 1 includes a P-type semiconductor layer 2. The semiconductor layer 2 may be a semiconductor substrate such as an Si (silicon) substrate or an SiC (silicon carbide) substrate, or an Si layer or an SiC layer formed by epitaxy or CVD.

Each memory cell includes one MOSFET (Metal Oxide Semiconductor Field-Effect Transistor) 3 and one ferroelectric capacitor 4.

The MOSFET 3 is formed on the semiconductor layer 2. In other words, an N-type drain region 5 and an N-type source region 6 are formed on a surface layer portion of the semiconductor layer 2 at an interval from each other. A gate insulating film 8 is formed on the semiconductor layer 2, to be opposed to a channel region 7 between the drain region 5 and the source region 6. The gate insulating film 8 is made of $SiO_2$, for example. A gate electrode 9 having the same shape as the gate insulating film 8 in plan view is formed on the gate insulating film 8. The gate electrode 9 is made of doped polysilicon (polysilicon doped with an N-type impurity in a high concentration, for example). Sidewalls 10 are formed on the periphery of the gate electrode 9. The sidewalls 10 cover the overall peripheries of the side surfaces of the gate insulating film 8 and the gate electrode 9. The sidewalls 10 are made of SiN (silicon nitride) or $SiO_2$, for example.

A first interlayer dielectric film 11 is stacked on the semiconductor layer 2. The first interlayer dielectric film 11 is made of $SiO_2$, for example.

The ferroelectric capacitor 4 is formed on the first interlayer dielectric film 11, on a position at least partially overlapping with the drain region 5 in plan view. The ferroelectric capacitor 4 has a structure obtained by stacking a lower electrode 12, a ferroelectric film 13 and an upper electrode 14 in this order on the first interlayer dielectric film 11. In other words, the ferroelectric capacitor 4 has a multilayer structure obtained by interposing the ferroelectric film 13 between the lower electrode 12 and the upper electrode 14 opposed thereto. The ferroelectric capacitor 4 necessarily has a trapezoidal sectional shape tapered upward, due to difficulty in etching for forming the same.

The lower electrode 12 is made of a conductive material containing a noble metal such as Ir.

The ferroelectric film 13 is made of PZT.

The upper electrode 14 includes an electrode lower layer 15 made of a conductive material containing Ir and an electrode upper layer 16 made of TiN stacked on the electrode lower layer 15. More specifically, the electrode lower layer 15 has a structure obtained by stacking an $IrO_2$ (iridium oxide) film, an Ir film and an IrTa alloy film in this order on the ferroelectric film 13. The IrTa alloy film has hydrogen barrier properties.

The upper surface of the electrode lower layer 15 has relatively large irregularities due to inferior surface morphology of the ferroelectric film 13. On the other hand, the upper surface of the electrode upper layer 16 is planarized into a planar surface independent of the surface morphology of the ferroelectric film 13.

The surfaces of the ferroelectric capacitor 4 and the first interlayer dielectric film 11 are covered with a hydrogen barrier film 17 for preventing the ferroelectric film 13 from characteristic deterioration resulting from hydrogen reduction. The hydrogen barrier film 17 is made of $Al_2O_3$, for example.

A second interlayer dielectric film 18 is stacked on the hydrogen barrier film 17. The second interlayer dielectric film 18 is made of $SiO_2$, for example.

A first contact plug 19 electrically connected with the drain region 5 and the lower electrode 12 and a second contact plug 20 electrically connected with the source region 6 are embedded in the first interlayer dielectric film 11.

More specifically, a first contact hole 21 penetrating through the first interlayer dielectric film 11 is formed between the drain region 5 and the lower electrode 12. A barrier metal film 22 is formed on the side surface of the first contact hole 21 and a portion of the drain region 5 facing the first contact hole 21. The barrier metal film 22 is made of TiN, for example. The first contact plug 19 is embedded in the first contact hole 21 through the barrier metal film 22. The first contact plug 19 is made of W, for example.

A second contact hole 23 penetrating through the first interlayer dielectric film 11 is formed above the source region 6. A barrier metal film 24 is formed on the side surface of the second contact hole 23 and a portion of the source region 6 facing the second contact hole 23. The barrier metal film 24 is made of the same material as the barrier metal film 22. The second contact plug 20 is embedded in the second contact hole 23 through the barrier metal film 24. The second contact plug 20 is made of the same material as the first contact plug 19.

A first via plug 25 electrically connected with the upper electrode 14 and a second via plug 26 electrically connected with the second contact plug 20 are embedded in the second interlayer dielectric film 18.

More specifically, a first via hole 27 is formed above the upper electrode 14. The first via hole 27 penetrates through the second interlayer dielectric film 18, further penetrates through the hydrogen barrier film 17, and reaches an intermediate portion of the electrode upper layer 16 of the upper electrode 14. A barrier metal film 28 is formed on the side surface of the first via hole 27 and a portion of the electrode upper layer 16 facing the first via hole 27. The barrier metal film 28 is made of TiN, for example. The first via plug 25 is embedded in the first via hole 27 through the barrier metal film 28. The first via plug 25 is made of W, for example.

A second via hole 29 is formed above the second contact plug 20. The second via hole 29 penetrates through the second interlayer dielectric film 18, further penetrates through the hydrogen barrier film 17, and reaches the second contact plug 20. A barrier metal film 30 is formed on the side surface of the second via hole 29 and a portion of the second contact plug 20 facing the second via hole 29. The barrier metal film 30 is made of the same material as the barrier metal film 28. The second via plug 26 is embedded in the second via hole 29 through the barrier metal film 30. The second via plug 26 is made of the same material as the first via plug 25.

A word line, a plate line and a bit line are connected to the gate electrode 9, the first via plug 25 and the second via plug 26 respectively. When a voltage is applied between the plate line and the bit line while the MOSFET 3 is turned on due to voltage application to the word line, the ferroelectric film 13 of the ferroelectric capacitor 4 causes spontaneous polarization. Thus, data is written, and held by maintaining the polarization state. In order to read the data, a pulse voltage is applied between the plate line and the bit line while the MOSFET 3 is turned on due to voltage application to the word line. When the direction of polarization of the ferroelectric film 13 changes due to the application of the pulse voltage, a current flows between the plate line and the bit line, and hence a logic signal "1" or "0" can be obtained in response to the presence or absence of the current.

FIGS. 2A to 2K are schematic sectional views successively showing the steps of manufacturing the semiconductor device 1.

Figure 2A:
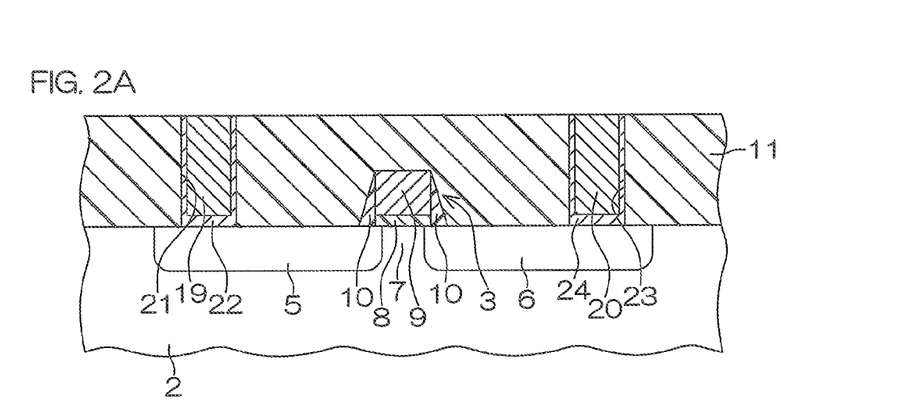
FIGS. 2A to 2K are schematic sectional views successively showing the steps of manufacturing the semiconductor device.

As shown in FIG. 2A, the MOSFET 3 (the drain region 5, the source region 6, the gate insulating film 8, the gate electrode 9 and the sidewalls 10), the first interlayer dielectric film 11, the first contact plug 19, the second contact plug 20, the first contact hole 21, the barrier metal film 22, the second contact hole 23 and the barrier metal film 24 are formed by well-known methods.

Figure 2B:
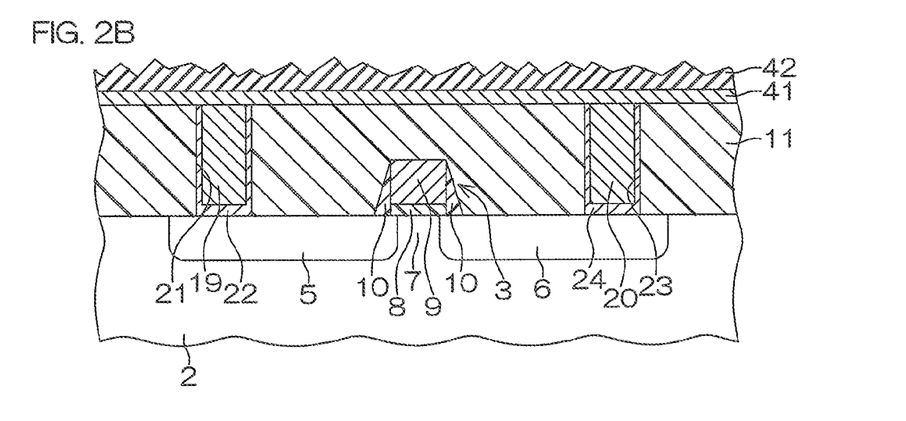

Thereafter a lower electrode material film 41 made of the material for the lower electrode 12 of the ferroelectric capacitor 4 is formed on the first interlayer dielectric film 11 by sputtering, as shown in FIG. 2B. Further, a PZT film 42 made of PZT for forming the ferroelectric film 13 is formed on the lower electrode material film 41 by MOCVD. The PZT film 42 formed by MOCVD has large crystal grain sizes, and inferior surface morphology.

Figure 2C:
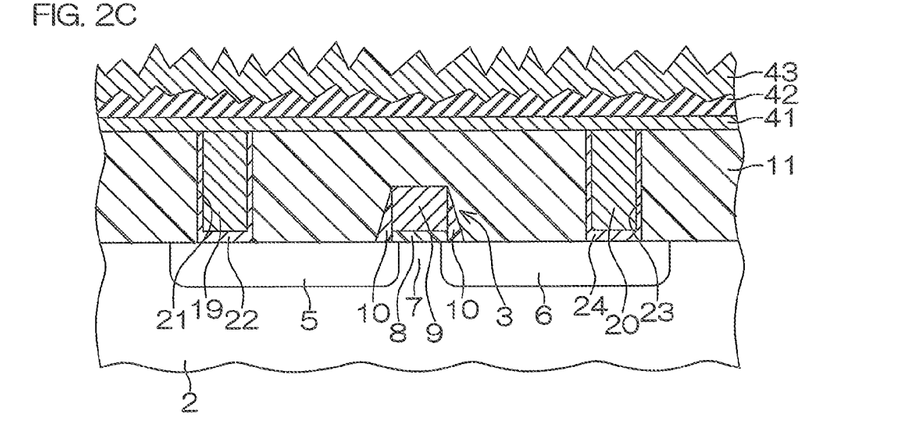

Then, a multilayer film 43 (an $IrO_2$ film, an Ir film and an IrTa alloy film) made of the material for the electrode lower layer 15 of the upper electrode 14 is formed on the PZT film 42 by sputtering, as shown in FIG. 2C. The multilayer film 43 also has inferior surface morphology, due to the inferior surface morphology of the PZT film 42.

Figure 2D:
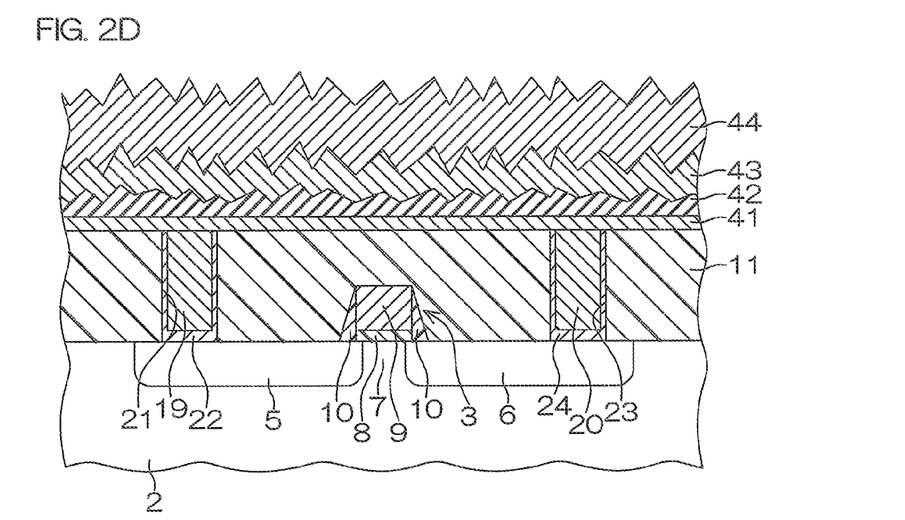

Then, a TiN film 44 made of TiN for forming the electrode upper layer 16 of the upper electrode 14 is formed on the multilayer film 43 by sputtering, as shown in FIG. 2D. The TiN film 44 has inferior surface morphology immediately after the formation thereof, due to the inferior surface morphology of the multilayer film 43.

Figure 2E:
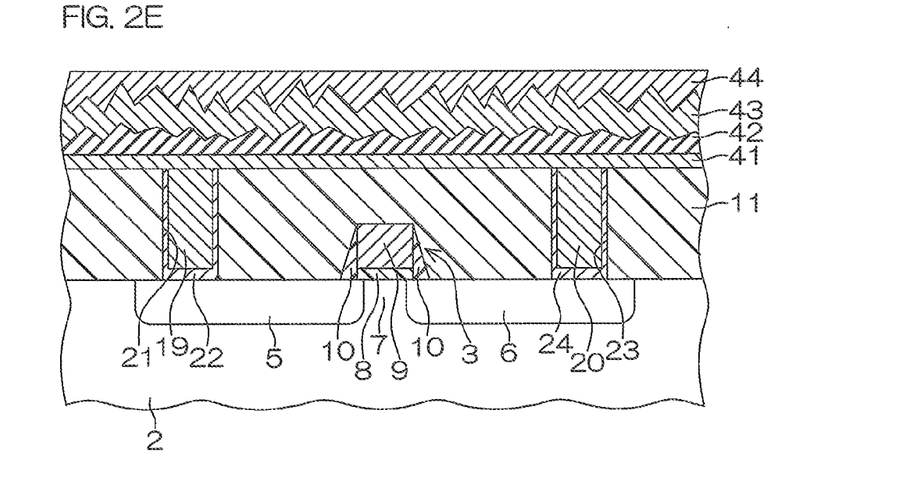

Thereafter the surface of the TiN film 44 is planarized by CMP (chemical-mechanical planarization), as shown in FIG. 2E. In the step shown in FIG. 2D, the TiN film 44 is formed with a thickness (500 nm, for example) in consideration of film loss resulting from the planarization.

Figure 2F:
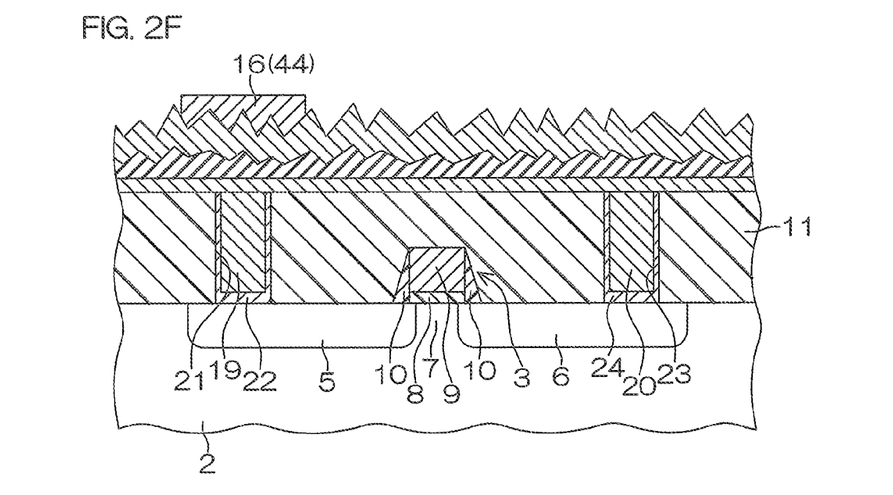

After the planarization of the TiN film 44, the TiN film 44 is patterned into the electrode upper layer 16 by photolithography and etching, as shown in FIG. 2F.

Figure 2G:
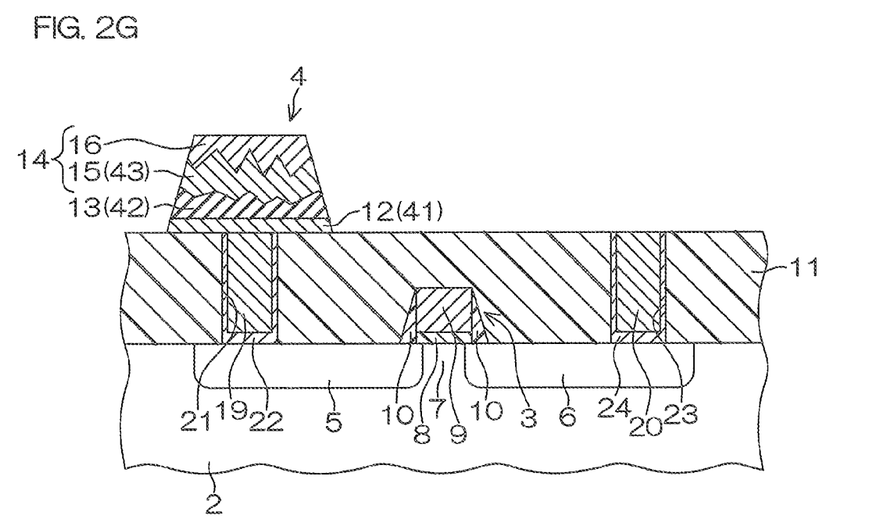

Then, portions of the multilayer film 43, the PZT film 42 and the lower electrode material film 41 exposed from the electrode upper layer 16 are successively removed by etching through the electrode upper layer 16 serving as a mask. At this time, the multilayer film 43, the PZT film 42 and the lower electrode material film 41 are continuously etched by switching reaction gas (etchant) at proper timing. Consequently, the lower electrode material film 41, the PZT film 42 and the multilayer film 43 are patterned into the lower electrode 12, the ferroelectric film 13 and the electrode lower layer 15 respectively, and the ferroelectric capacitor 4 consisting of the lower electrode 12, the ferroelectric film 13, the electrode lower layer 15 and the electrode upper layer 16 is obtained, as shown in FIG. 2G.

Figure 2H:
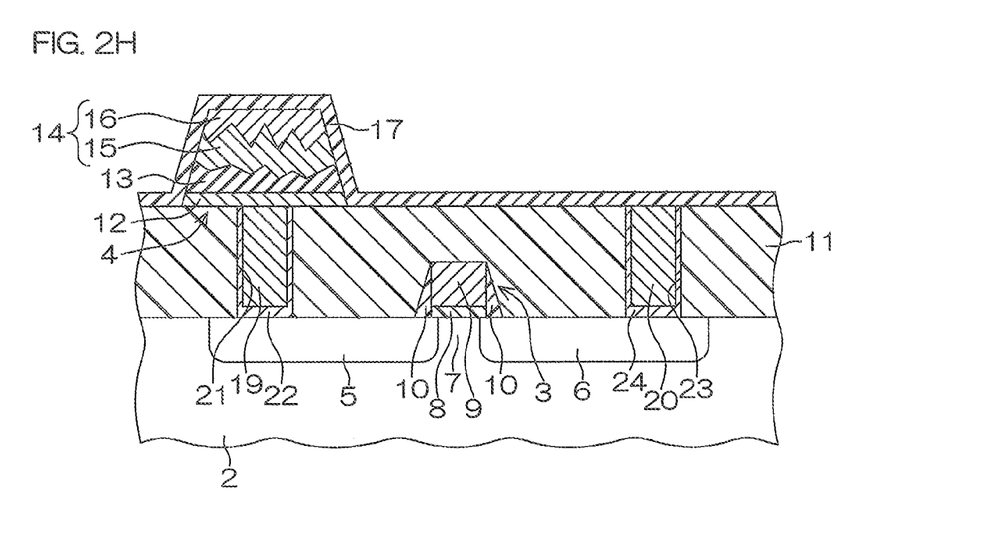

Thereafter the hydrogen barrier film 17 is formed on the first interlayer dielectric film 11 and the ferroelectric capacitor 4 by sputtering, as shown in FIG. 2H. The upper surface of the electrode upper layer 16 is planar, whereby the hydrogen barrier film 17 has a generally uniform thickness on the electrode upper layer 16 (the ferroelectric capacitor 4), and is formed with a planar upper surface.

Figure 2I:
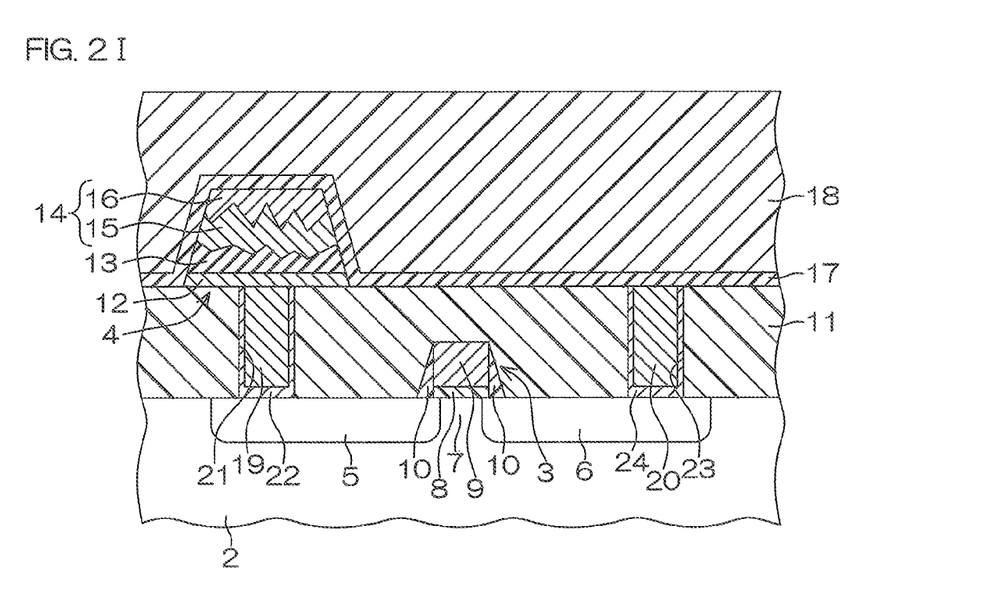

Then, the second interlayer dielectric film 18 is formed on the hydrogen barrier film 17 by CVD, as shown in FIG. 2I. The surface of the ferroelectric capacitor 4 is covered with the hydrogen barrier film 17, whereby the ferroelectric film 13 can be prevented from hydrogen reduction, even if CVD employing H gas is used as the method of forming the second interlayer dielectric film 18.

Figure 2J:
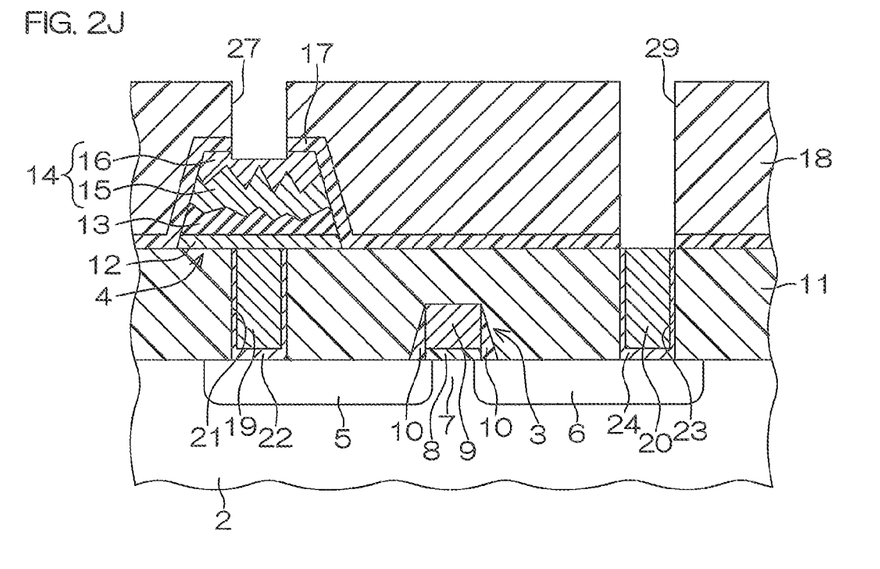

Then, the first via hole 27 and the second via hole 29 are formed in the second interlayer dielectric film 18 by photolithography and etching, as shown in FIG. 2J.

Figure 2K:
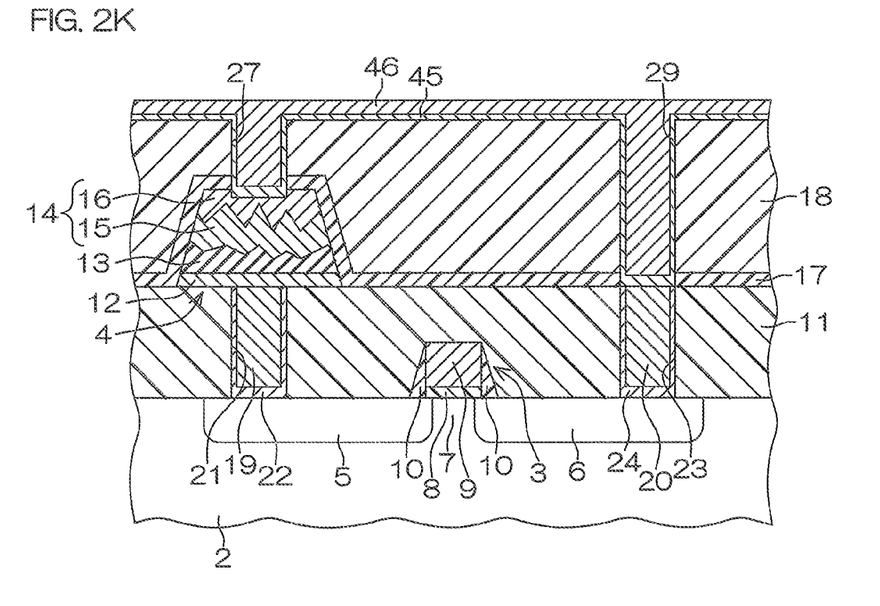

Thereafter a barrier metal material film 45 made of the material for the barrier metal films 28 and 30 is formed on the second interlayer dielectric film 18 by sputtering, as shown in FIG. 2K. The barrier metal material film 45 is formed also in the first via hole 27 and the second via hole 29. The upper surface of the electrode upper layer 16 is planar, whereby the barrier metal material film 45 has a generally uniform thickness on the electrode upper layer 16. Then, a deposition layer 46 made of the material for the first via plug 25 and the second via plug 26 is stacked on the barrier metal material film 45 by CVD. Then, the deposition layer 46 and the barrier metal material layer 45 are polished by CMP. The polishing is continued until unnecessary portions of the barrier metal material layer 45 and the deposition layer 46 formed outside the first via hole 27 and the second via hole 29 are removed and the surfaces of the portions of the deposition layer 46 left in the first via hole 27 and the second via hole 29 are flush with the surface (the upper surface) of the second interlayer dielectric film 18. Consequently, the first via plug 25 embedded in the first via hole 27 through the barrier metal film 28 and the second via plug 26 embedded in the second via hole 29 through the barrier metal film 30 are formed, and the semiconductor device 1 shown in FIG. 1 is obtained.

In the semiconductor device 1, as hereinabove described, the upper electrode 14 having the multilayer structure of the electrode lower layer 15 in contact with the ferroelectric film 13 and the electrode upper layer 16 stacked on the electrode lower layer 15 is stacked on the ferroelectric film 13. The upper surface of the electrode upper layer 16 is planarized into the planar surface independent of the surface morphology of the ferroelectric film 13. Therefore, the hydrogen barrier film 17 and the barrier metal film 28 (the barrier metal material film 45) can be formed with generally uniform thicknesses on the electrode upper layer 16, and defective coverage of the films 17 and 28 on the upper electrode 14 can be prevented.

Consequently, the hydrogen barrier film 17 can excellently prevent the ferroelectric film 13 from hydrogen reduction, thereby preventing characteristic deterioration of the ferroelectric film 13. Further, the barrier metal film 28 can excellently prevent metal diffusion from the first via plug 25 into the insulating film. Thus, the reliability of the semiconductor device 1 can be improved, and the life thereof can be increased.

When the deposition layer 46 is stacked by CVD, reaction between $WF_6$ gas and the material for the second interlayer dielectric film 18 can be prevented in the process of the deposition, due to the excellent coverage of the barrier metal film 28. Consequently, the barrier metal films 28 and 30 can be prevented from peeling and corrosion.

Further, SiN employed as the material for the electrode upper layer 16 has an etching selection ratio with respect to the materials (PZT and the conductive material containing the noble metal such as Ir) for the ferroelectric film 13 and the electrode lower layer 15, whereby the electrode upper layer 16 can be utilized as an etching mask for forming the ferroelectric film 13 and the electrode lower layer 15 after the formation of the electrode upper layer 16.

Also in the process of manufacturing the conventional semiconductor device shown in FIG. 3, an etching mask is indispensable for forming the ferroelectric film and the upper electrode (for patterning the multilayer film made of the materials for the ferroelectric film and the upper electrode). Therefore, an electrode having a planar upper surface can be obtained by simply adding the step of planarizing the film made of the material for the electrode upper layer 16 to the manufacturing steps for the conventional semiconductor device, by utilizing the electrode upper layer 16 as the etching mask for forming the ferroelectric film 13 and the electrode lower layer 15.

In order to planarize the upper surface of the upper electrode 14, the ferroelectric film 13 or the electrode lower layer 15 may conceivably be planarized. If the ferroelectric film 13 is planarized, however, bad influence is exerted on the crystallinity thereof, to reduce the ferroelectricity. The electrode lower layer 15 is made of the conductive material containing the noble metal such as Ir, and hence it is difficult to planarize the electrode lower layer 15. The electrode upper layer 16 is made of TiN, and hence the upper surface thereof can be easily planarized.

When the first via hole 27 penetrates through the IrTa alloy film forming a surface layer portion of the electrode lower layer 15, the hydrogen barrier properties by the IrTa alloy film may be damaged, and the characteristics of the ferroelectric film 13 may be deteriorated due to penetration of H from the first via hole 27. Therefore, the deepest portion of the first via hole 27 is arranged on the intermediate portion in the thickness direction of the electrode upper layer 16. Thus, the hydrogen barrier properties by the IrTa alloy film of the electrode lower layer 15 can be ensured, and the ferroelectric film 13 can be prevented from characteristic deterioration resulting from penetration of H from the first via hole 27.

The material for the electrode lower layer 15 is not restricted to the conductive material containing Ir, but may be a conductive material containing a noble metal (Au or Pt, for example) other than Ir.

The material for the electrode upper layer 16 is not restricted to TiN, but may simply be a conductive material such as TaN or WN, for example, having an etching selection ratio with respect to the ferroelectric film 13 and the electrode lower layer 15.

The present invention may be embodied in other ways, and can be applied to a ferroelectric memory having a 1T cell structure, for example.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:

1. A semiconductor device, comprising:
   a ferroelectric film including PZT;
   an electrode stacked on the ferroelectric film;
   the electrode including a multi-layer structure of an electrode lower layer in contact with the ferroelectric film and an electrode upper layer stacked on the electrode lower layer;
   the electrode upper layer including a conductive material having Titanium and Nitrogen; and
   a hydrogen barrier film covering surfaces of the ferroelectric film and the electrode;
   wherein an upper surface of the electrode upper layer is smoother, relatively, than an upper surface of the ferroelectric film;
   wherein the upper surface of the ferroelectric film is smoother, relatively, than the upper surface of the electrode lower layer;
   wherein an opening is fabricated as a via hole at the hydrogen barrier film;
   wherein a barrier metal is disposed covering a surface of the opening;
   wherein a via plug is disposed filling the barrier metal;
   wherein an interface between the barrier metal and the via plug is placed under a surface of the hydrogen barrier film in a vertical direction; and
   wherein the interface is flat.

2. The semiconductor device according to claim 1, wherein the upper surface of the electrode upper layer is planarized.

3. The semiconductor device according to claim 1, wherein a lower surface of the electrode upper layer is not planarized.

4. The semiconductor device according to claim 1, wherein the hydrogen barrier film has a generally uniform thickness.

5. The semiconductor device according to claim 1, wherein the upper surface of the electrode lower layer has a morphology based on a morphology of the upper surface of the ferroelectric film.

6. The semiconductor device according to claim 1, wherein the upper surface of the ferroelectric film and the upper surface of the electrode lower layer have a rough shape based on the morphology of the ferroelectric film.

7. The semiconductor device according to claim 1, further comprising a lower electrode opposed to the electrode through the ferroelectric film.

8. The semiconductor device according to claim 1, wherein the electrode upper layer is made of titanium nitride.

9. The semiconductor device according to claim 1, wherein the electrode upper layer is made of tantalum nitride.

10. The semiconductor device according to claim 1, wherein the electrode upper layer is made of tungsten nitride.

11. The semiconductor device according to claim 4, wherein the thickness of the ferroelectric film is not more than 100 nm.

12. A semiconductor device, comprising:
    a ferroelectric film;
    an electrode stacked on the ferroelectric film, the electrode including a two-layer structure of an electrode lower layer in contact with the ferroelectric film and an electrode upper layer stacked on the electrode lower layer;
    the electrode upper layer including a composition made of at least Titanium and Nitrogen, an upper surface of the electrode upper layer being planarized, and a lower surface of the electrode upper layer not being planarized; and
    a hydrogen barrier film covering surfaces of the ferroelectric film and the electrode, the hydrogen barrier film having a generally uniform thickness;
    wherein an upper surface of the electrode lower layer has a morphology that is based on a morphology of an upper surface of the ferroelectric film;
    wherein the upper surface of the ferroelectric film and the upper surface of the electrode lower layer have a rough shape based on the morphology of the ferroelectric film;
    wherein the upper surface of the electrode upper layer is smoother than the upper surface of the ferroelectric film and the upper surface of the electrode lower layer;
    wherein the upper surface of the ferroelectric film is smoother, relatively, than the upper surface of the electrode lower layer;
    wherein an opening is fabricated as a via hole at the hydrogen barrier film;
    wherein a barrier metal is disposed covering a surface of the opening;
    wherein a via plug is disposed filling the barrier metal;

wherein an interface between the barrier metal and the via plug is placed under a surface of the hydrogen barrier film in a vertical direction; and wherein the interface is flat.

13. The semiconductor device according to claim 12, wherein the ferroelectric film is made of a material including PZT.

* * * * *